(12) United States Patent
Silver et al.

(10) Patent No.: US 8,054,189 B2
(45) Date of Patent: Nov. 8, 2011

(54) LIFE SAFETY DEVICE WITH AUTOMATIC BATTERY DISCHARGE AT THE END OF LIFE

(75) Inventors: Travis Silver, Colorado Springs, CO (US); Stan Burnette, Colorado Springs, CO (US); Matthew J. Buchholz, Canon City, CO (US)

(73) Assignee: Walter Kidde Portable Equipment Inc., Mebane, NC (US)

( * ) Notice: Subject to any disclaimer, the term of this patent is extended or adjusted under 35 U.S.C. 154(b) by 492 days.

(21) Appl. No.: 12/288,162

(22) Filed: Oct. 16, 2008

(65) Prior Publication Data

US 2010/0097211 A1 Apr. 22, 2010

(51) Int. Cl.
*G08B 21/00* (2006.01)
*G08B 17/10* (2006.01)
*H02J 7/00* (2006.01)
*H02J 7/04* (2006.01)

(52) U.S. Cl. ............... 340/636.15; 340/600; 340/629; 340/628; 340/663; 320/132; 320/162

(58) Field of Classification Search .............. 340/540, 340/636.15
See application file for complete search history.

(56) References Cited

U.S. PATENT DOCUMENTS

| | | | | |
|---|---|---|---|---|
| 4,155,081 | A * | 5/1979 | Haglund | 340/629 |
| 5,574,436 | A * | 11/1996 | Sisselman et al. | 340/663 |
| 5,677,615 | A * | 10/1997 | Takano et al. | 320/152 |
| 6,144,186 | A | 11/2000 | Thandiwe et al. | |
| 6,414,599 | B1 * | 7/2002 | Hsieh | 340/628 |
| 6,639,386 | B2 * | 10/2003 | Shiojima | 320/132 |
| 7,123,158 | B2 | 10/2006 | Deluca et al. | |
| 2002/0000790 | A1 | 1/2002 | Sano et al. | |
| 2003/0020619 | A1 * | 1/2003 | Winters et al. | 340/632 |
| 2006/0082464 | A1 | 4/2006 | Andres et al. | |
| 2010/0076714 | A1 * | 3/2010 | Discenzo | 702/104 |

OTHER PUBLICATIONS

Battery Protection for Single-Cell Pack (product specification) S-8261 Series, Rev. 1.1, Seiko Instruments Inc. (26 pages).
VFM Step-Up DC/DC Converter Controller (product specification) RN5RY 202, No. EA-042-0204, RICOH (9 pages).
CET Dual N-Channel Enhancement Mode Field Effect Transistor (product specification) CEG8205, Dec. 2002, http://www.setsemi.com (3 pages).
Adjustable Precision Shunt Regulators (product specification) TL431, TL431A, TL431B, TL432, TL432A and TL432B; SLVS543J—Aug. 2004, Revised Dec. 2005; Texas Instruments, Dallas, Texas; Copyright 2005, Texas Instruments Incorporated (67 pages).
Programmable Shunt Regulator (product specification) TL431/TL431A, Rev. 1.0.3, Copyright 2003 Fairchild Semiconductor Corporation (10 pages).
CET N-Channel Enhancement Mode Field Effect Transistor (product specification) CES3212, Nov. 2005, http://www.setsemi.com (3 pages).
The International Search Report and Written Opinion of the International Searching Authority in counterpart foreign application No. PCT/US2009/005654 filed Oct. 16, 2009.

* cited by examiner

*Primary Examiner* — George Bugg
*Assistant Examiner* — Jack Wang
(74) *Attorney, Agent, or Firm* — Kinney & Lange, P.A.

(57) ABSTRACT

When a rechargeable battery of a life safety device reaches its end of life, the life safety device provides an audible signal indicating that replacement is required. When the device is disconnected from line power, the rechargeable battery still contains a significant amount of energy. The device automatically begins controlled discharge the battery until the stored energy has been reduced to a safe level for disposal of the life safety device and its battery.

21 Claims, 2 Drawing Sheets

LIFE SAFETY DEVICE WITH AUTOMATIC BATTERY DISCHARGE AT THE END OF LIFE

BACKGROUND

The present invention relates to life safety devices, and in particular to hazard detectors such as carbon monoxide and smoke detectors that are typically mounted on walls and ceilings of buildings.

Life safety devices are used in residential and commercial buildings to provide warning to occupants of hazards such as fire or buildup of unsafe gases, such as carbon monoxide. Life safety devices may be powered by a battery assembly that includes a rechargeable battery. The life safety device is connected to a source of AC power, which provides electrical power for charging the rechargeable battery.

When the life safety device reaches the end of its useful life, it may generate a warning signal, such as a chirping sound indicating that it has entered a "trouble" (or "end of life") mode. This signals the user that it is time to disconnect the life safety device from AC power and throw it away. Rechargeable batteries, such as rechargeable lithium ion batteries, can contain a substantial amount of energy. If not discharged before disposal, they can pose a risk of being damaged and causing a fire and other serious injury. In the case of a life safety device, a rechargeable battery cannot be discharged quickly by shorting the output, because the battery assembly includes a battery protection circuit that will prevent rapid discharge in order to protect the battery. In addition, quickly discharging the battery can cause excessive amounts of heat.

In the past, life safety devices have made use of a mechanical element, such as a switch, to apply a resistance across the battery terminals in order to discharge the battery prior to disposal. A disadvantage of using a switch to discharge the battery is that it relies on the user to actuate the switch. If the user does not actuate the switch, the life safety device and its battery may be disposed of in an unsafe condition.

SUMMARY

Life safety device provides an automatic battery discharge operation after detecting that the device has reached an end of life condition. Life safety device includes a controller that causes an audible warning signal to be generated when an end of life condition is detected. When a user disconnects the life safety device from a source of AC power used to charge the rechargeable battery, the controller initiates a discharge sequence in which the battery is slowly discharged until the stored energy in the battery has been reduced to a safe level.

In one embodiment, the discharge battery is performed by battery test electronics. A low duty cycle discharge control pulse is used to drain power from the battery in a controlled way that does not produce significant amounts of heat, but completes the discharge of the battery in a short period of time.

DETAILED DESCRIPTION

Figure 1:
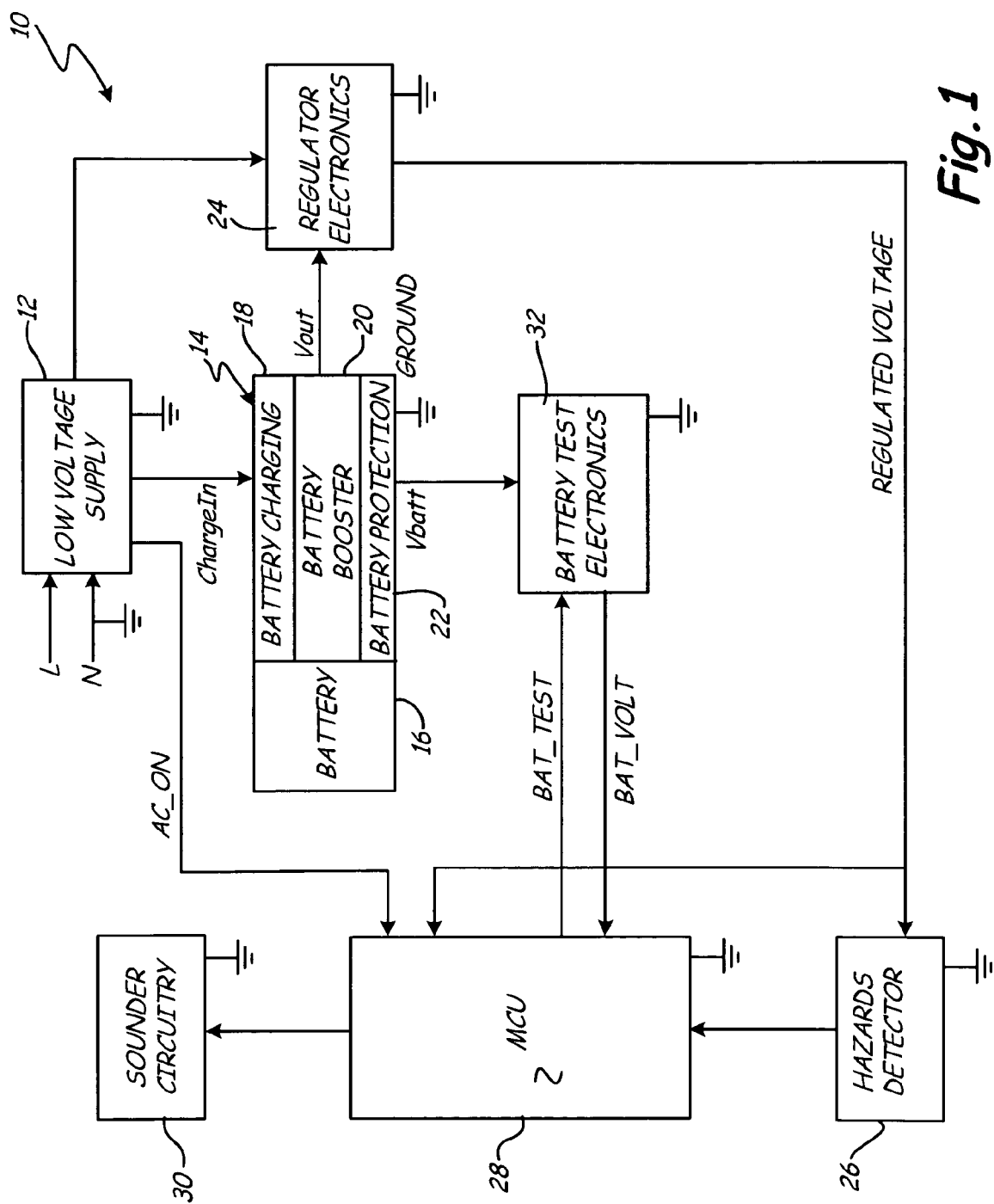
FIG. 1 is a block diagram of a life safety device.

FIG. 1 shows a block diagram of life safety device 10, which may be, for example, a smoke alarm, a carbon monoxide (CO) alarm, a combination smoke and CO alarm, or a similar device for providing warning to occupants of a residence or other building of a potentially life threatening condition. Life safety device 10 is typically mounted on a wall or ceiling, and is connected to a source of alternating current (AC) power.

As shown in FIG. 1, life safety device includes low voltage supply 12, battery assembly 14 (which includes rechargeable battery 16, battery charging circuit 18, booster circuit 20, and battery protection circuit 22), regulator electronics 24, hazards detector 26, microcontroller unit (MCU) 28, sounder circuitry 30, and battery test electronics 32.

Low voltage supply 12 is connected to an AC mains input, as represented by line input L and neutral input N. Low voltage supply 12 converts AC input power to DC charging power, which is provided to the Charge In input of battery assembly 14 and regulator electronics 24. Low voltage supply 12 also provides an AC_ON monitoring signal to MCU 28, which indicates that low voltage supply 12 is receiving AC power from the AC mains input.

Battery 16 of battery assembly 14 is a long life rechargeable battery, such as a lithium ion rechargeable battery. Battery charging circuit 18 maintains charge on battery 16 using the charging power from low voltage supply 12. Booster circuit 20 increases battery voltage Vbatt, which may range from about 2.2 to 4.2 volts, to output voltage Vout, which is used by regulator electronics 24 to provide regulated voltage to hazards detector 26 and MCU 28. Vout may be, for example, a constant voltage of about 8.7 volts.

Battery protection circuit 22 provides protection to battery 16 against over-current and over-discharge conditions. Battery protection circuit 22 enters protection modes, in which battery 16 may be disconnected from other circuit components when the battery voltage Vbatt is too low (an over-discharge condition) or when the current being drawn from battery 16 exceeds a maximum current level (over-current protection).

Hazards detector 26 may be, for example, a photoelectric or ionization type smoke detector, a carbon monoxide detector, or a combination smoke and carbon monoxide detector. The output of hazards detector 26 is provided to MCU 28.

MCU 28 coordinates and controls the operation of life safety device 10. Based upon inputs received from hazards detector 26, MCU 28 determines whether a condition exists that requires sounding an alarm to warn users of a potentially dangerous condition. If an alarm is required, MCU 28 provides control signals to sounder circuitry 30 to generate the appropriate alarm. In some cases, the alarm will be an audible signal generated continuously or in pulses. In other embodiments, sounder circuitry 30 may generate a verbal message (or a combination of an audible signal and a verbal message) to occupants in response to a command from MCU 28.

During the course of operation of life safety device 10, MCU 28 will periodically perform a battery test using battery test electronics 32. At the appropriate time, MCU 28 provides a battery test pulse BAT_TEST to battery test electronics 32, which causes battery test electronics 32 to turn on and draw current from the Vbatt output of battery assembly 14. Battery test electronics 32 provides test output BAT_VOLT to MCU 28 that represents the measured battery voltage while the discharge is taking place. During this normal battery test operation, the battery test pulse BAT_TEST is very short (typically 100 microseconds). The duration of the battery test pulse is selected to be just long enough to make sure that a steady state condition is reached. The battery voltage is measured, and the test is then terminated so that battery 16 is allowed to recover from the discharge.

MCU 28 includes an internal timer for determining when life safety device 10 has reached its normal end of life. At that time, MCU 28 initiates an end of life mode which notifies the user that device 10 should be replaced, and automatically controls discharging of battery 16 so that a disposal of life safety device 10, battery 16 will not pose a safety hazard due to the charge remaining in battery 16. In performing the automatic discharging function, MCU 28 makes use of battery test electronics 32 to perform discharging of battery 16 at a low duty cycle that will not cause overheating and will not result in battery protection circuitry 22 preventing discharging of battery 16, while still performing the discharging in a rapid manner.

Figure 2:
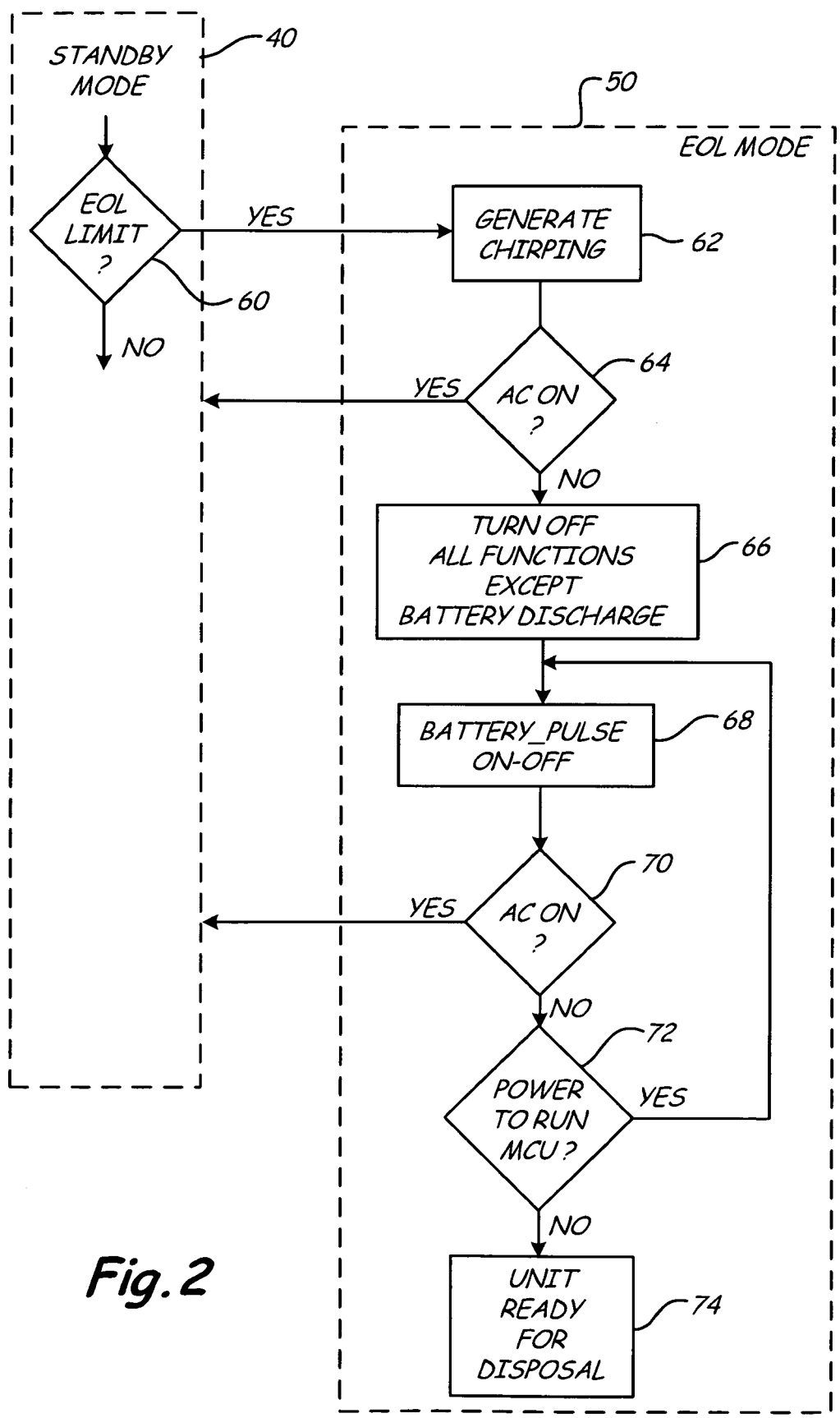
FIG. 2 is a flow chart illustrating operation of the life safety device of FIG. 1 in an end of life mode.

FIG. 2 is a flow diagram illustrating the operation of MCU 28 as it transitions from standby mode 40 to end of life (EOL) mode 50. As part of standby mode 40, MCU 28 checks to determine whether the end of life (EOL) limit has been reached (step 60). If the EOL limit has not been reached, MCU 28 continues normal operation mode 40. If the EOL limit has been reached, MCU 28 enters the end of life (EOL) mode (50). At the beginning of at the end of life mode 50, MCU 28 causes sounder circuitry 30 to produce a distinctive signal that indicates to the user that device 10 needs replacement (step 62). In one embodiment, this unique signal is a chirping sound generated every 30 seconds.

MCU 28 checks the status of the AC_ON signal from low voltage supply 32 (step 64). As long as the AC_ON signal indicates that device 10 is still connected to AC power, MCU 28 returns to standby mode 40. Each time step 60 is reached, steps 62 and 64 will be repeated. In other words, MCU 28 continues to monitor the output of hazards detector 26, and will cause an alarm to be generated through sounder circuitry 30 if a hazardous condition is detected. Sounder circuitry 30 will continue to generate the chirping sound while MCU 28 continues to monitor the output of hazards detector 26.

When device 10 is unplugged from the AC source, the AC_ON signal changes state to indicate that AC power is not present. MCU 28 then turns off all functions of device 10, including the chirping output of sounder circuitry 30 and the monitoring of hazards detector 26 (step 66). The only function remaining is a battery discharge function performed by MCU 28 in conjunction with battery test electronics 32.

MCU 28 turns battery test electronics 32 on and off with the BAT_TEST signal according to a low duty cycle will produce controlled discharging of battery 16 (step 68). MCU 28 continues to check the AC_ON signal to see whether device 10 has been reconnected to AC power (step 70). During this discharge function, no user interface (such as through sounder circuitry 30) is active.

The duty cycle the BAT_TEST signal from MCU 28 during the controlled discharge function is low enough so that significant heating does not result from turning the battery test electronics on to discharge battery 16. At the same time, the duty cycle is selected so that the controlled discharging of battery 16 occurs relatively quickly in preparation for disposal of device 10. The duty cycle is less than 50% and preferably less than about 25%. In one embodiment, the duty cycle of the BAT_TEST signal during controlled discharge operation is one (1) millisecond ON followed by nine (9) milliseconds OFF. Thus discharging takes place only during one-tenth of each 10 millisecond cycle. The ON time of one millisecond used during the controlled discharge operation is significantly longer than the ON time used during normal battery test (which is typically on the order of 10 microseconds).

MCU 28 continues to monitor the AC_ON signal in case either AC mains power from the power utility has been temporarily interrupted, or the user has disconnected device 10 temporarily from AC power, but then reconnected it (step 70). If the AC-ON signal indicates that device 10 has been reconnected (or AC power has been restored), MCU 28 returns to standby mode 40 and then reenters EOL mode 50 at step 60. The process shown in FIG. 2 will then be repeated, with MCU 28 causing sounder circuitry 30 to once again alert the user that end of life has been reached, and that device 10 should be replaced.

If device 10 is not reconnected to AC power, MCU 28 continues to operate as long as battery assembly 14 can provide enough power to operate MCU 28 and battery test electronics 32 (step 72). If adequate power to continue operation is present, further discharging is needed, and MCU 28 returns to step 68. Once power is no longer adequate to run MCU 28 and battery test electronics 32, the discharge process is complete. Device 10 is dead and can be disposed of with household refuse (step 74).

The automatic controlled discharge function associated with end of life mode 50 will only occur when MCU 28 has determined that device 10 has reached the end of life. Controlled discharge only begins after device 10 has been disconnected from AC power. If device 10 is reconnected to AC power, the controlled discharge function will not recommence until device 10 is again disconnected from AC power.

If device 10 is disconnected from AC power prior to a determination that device 10 has reached its end of life, standby mode 40 will continue with device 10 using the power from battery 16. EOL mode 50 will not be entered, because the EOL limit has not been reached (step 60). For example, if AC power from a power utility is temporarily lost, device 10 will continue to operate on power from battery 16. When AC power is established, battery 16 will be recharged by low voltage supply 12.

Although the present invention has been described with reference to preferred embodiments, workers skilled in the art will recognize that changes may be made in form and detail without departing from the spirit and scope of the invention.

The invention claimed is:

1. A life safety device comprising:
 a battery assembly including a rechargeable battery;
 a voltage supply connectable to a source of alternating current (AC) power for supplying direct current (DC) charging power to the battery assembly;
 a hazard detector for sensing presence of a hazardous condition;
 a sound generator; and
 a controller for causing the sound generator to produce an alarm when the hazard detector has sensed the presence of a hazardous condition, and for automatically causing the battery to be discharged to a safe level for disposal when an end of life limit has been reached and the voltage supply has been disconnected from the source of AC power.

2. The life safety device of claim 1 wherein the controller, upon determining that the end of life limit has been reached, causes the sound generator to produce a signal indicating that the end of life limit has been reached.

3. The life safety device of claim 2, wherein the controller, upon receiving a signal from the voltage supply indicating that the voltage supply has been disconnected from the source of AC power after the end of life limit has been reached, discontinues all functions of the life safety device and initiates a battery discharge operation.

4. The life safety device of claim 3, wherein the controller causes the rechargeable battery to be discharged at a controlled rate during the battery discharge operation.

5. The life safety device of claim 4, wherein during the battery discharge operation, the controller causes the rechargeable battery to discharge according to a low duty cycle discharge control signal.

6. The life safety device of claim 5, wherein the low duty cycle discharge control signal has a duty cycle of less than about 25%.

7. The life safety device of claim 6, wherein the duty cycle is about 10%.

8. The life safety device of claim 5, wherein the discharge control signal has a discharge ON time duration of about 1 ms.

9. The life safety device of claim 3 and further comprising:
a battery test circuit connected to the battery for drawing current from the battery in response to a battery test signal and producing a measured battery voltage signal.

10. The life safety device of claim 9, wherein the controller provides the battery test signal to the battery test circuit to cause controlled discharge of the rechargeable battery during the battery discharge operation.

11. The life safety device of claim 10, wherein the controller monitors the measured battery voltage signal from the battery test circuit during the battery discharge operation to determine when the battery has reached a condition in which it is safe for disposal.

12. The life safety device of claim 11, wherein the controller terminates the battery discharge operation when the battery has reached a condition in which it is safe for disposal.

13. A method of preparing a life safety device having a rechargeable battery for disposal, the method comprising:
determining when the life safety device has reached an end of life condition;
providing a signal indicating the life safety device has reached the end of life condition;
detecting a loss of input AC power to the life safety device after the end of life condition has been determined; and
automatically initiating, in response to loss of input AC power, a controlled discharge function in which the battery is discharged to a threshold level at which the battery is safe for disposal.

14. The method of claim 13 and further comprising;
continuing normal functions of the life safety device after determining the life safety device has reached the end of life condition and before detecting the loss of input AC power.

15. The method of claim 14 and further comprising:
discontinuing normal functions of the life safety device after the life safety device has reached the end of life condition and loss of input AC power has been detected.

16. The method of claim 13 wherein the controlled discharge function comprises:
discharging the battery according to an ON/OFF duty cycle; and
monitoring for return of input AC power.

17. The method of claim 16 wherein the ON/OFF cycle has an ON time of less than about 25% of the cycle.

18. The method of claim 16, wherein the ON time is about 1 ms.

19. The method of claim 16 and further comprising:
returning to normal functions of the life safety device upon detecting the return of input AC power.

20. The method of claim 13, wherein the signal indicating the battery has reached an end of life condition comprises an audible signal, a voice message, or a combination of an audible signal and a voice message.

21. The method of claim 13, wherein the controlled discharge function utilizes battery test circuitry of the life safety device.

* * * * *